United States Patent
Hao et al.

(10) Patent No.: US 11,405,025 B1
(45) Date of Patent: Aug. 2, 2022

(54) FREQUENCY DIVIDER FUNCTIONALITY DETECTION AND ADJUSTMENT

(71) Applicant: QUALCOMM INCORPORATED, San Diego, CA (US)

(72) Inventors: Shilei Hao, San Diego, CA (US); Yiwu Tang, San Diego, CA (US); Yunliang Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/470,928

(22) Filed: Sep. 9, 2021

(51) Int. Cl.
*H03K 5/00* (2006.01)
*H03L 7/093* (2006.01)
*H03L 7/099* (2006.01)
*H03K 3/03* (2006.01)

(52) U.S. Cl.
CPC ....... *H03K 5/00006* (2013.01); *H03K 3/0315* (2013.01); *H03L 7/093* (2013.01); *H03L 7/0995* (2013.01)

(58) Field of Classification Search
CPC .. H03K 5/00006; H03K 3/0315; H03L 7/093; H03L 7/0995
USPC ............................ 331/57, 16, 34; 377/47, 48
See application file for complete search history.

(56) References Cited

U.S. PATENT DOCUMENTS

2002/0153959 A1* 10/2002 Gotz ..................... H03L 7/1072
331/1 A

* cited by examiner

*Primary Examiner* — Arnold M Kinkead
(74) *Attorney, Agent, or Firm* — Smith Tempel Blaha LLC/Qualcomm

(57) ABSTRACT

A frequency divider functionality detection and adjustment circuit includes an auxiliary voltage controlled oscillator (VCO) coupled to a first multiplexer (MUX), a programmable divider coupled to the first MUX, a second MUX coupled to the programmable divider, a counter coupled to the second MUX, and a controller coupled to the counter, the controller configured to adjust a supply voltage provided to the programmable divider based on a measured divide ratio, NMEAS.

28 Claims, 8 Drawing Sheets

FREQUENCY DIVIDER FUNCTIONALITY DETECTION AND ADJUSTMENT

FIELD

The present disclosure relates generally to electronics, and more specifically to radio frequency (RF) transmitters and receivers.

BACKGROUND

Wireless communication devices and technologies are becoming ever more prevalent. Wireless communication devices generally transmit and receive communication signals. A communication signal is typically processed by a variety of different components and circuits. One of the circuits which may be involved in the processing of a communication signal is a phase locked loop (PLL). A PLL is a device that compares the phase and/or frequency of two different signals and generates an error signal that represents the phase and/or frequency difference between the two compared signals. When the two signals have different phase and/or frequencies, the phase and/or frequency difference between the two signals is constantly varying. The error signal is then used to control the phase and/or frequency of the loop, such that when the phase and/or frequency difference between the two signals is fixed, the two signals are at the same phase and/or frequency. A PLL typically includes a phase and/or frequency comparator or detector, a voltage controlled oscillator (VCO) that can adjust the frequency of the PLL based on a control voltage signal, a filter circuit, a feedback circuit that includes a frequency divider, and may include other circuits, such as a buffer circuit, etc.

In addition to being used in the PLL circuit, a frequency divider may be used for other purposes, such as, for example, to develop various local oscillator (LO) signals, such as, for example, the quadrature LO signals used in some transceiver architectures. The LO signal is a frequency reference signal and may be used by the transmitter and/or the receiver in the wireless communication device to process transmitted and received radio frequency (RF) signals. Regardless of the frequency divider application, it is desirable to minimize the power consumed by a frequency divider.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a frequency divider functionality detection and adjustment circuit, including an auxiliary voltage controlled oscillator (VCO) coupled to a first multiplexer (MUX), a programmable divider coupled to the first MUX, a second MUX coupled to the programmable divider, a counter coupled to the second MUX, and a controller coupled to the counter, the controller configured to adjust a supply voltage provided to the programmable divider based on a measured divide ratio, NMEAS.

Another aspect of the disclosure provides a method for adjusting a frequency divider including generating a first signal, FVCO, dividing the first signal, FVCO, to generate a second signal, FDIV, determining a frequency of the first signal, FVCO, determining a frequency of the second signal, FDIV, determining a divide ratio, NMEAS, based on the determined frequency of the first signal, FVCO, and the determined frequency of the second signal, FDIV, comparing the divide ratio, NMEAS, with a target divide ratio NDIV, and adjusting a divider control signal to obtain a minimum voltage level that causes NMEAS to equal NDIV.

Another aspect of the disclosure provides a device including means for generating a first signal, FVCO, means for generating a second signal, FDIV, based on the first signal, FVCO, means for determining a frequency of the first signal, FVCO, means for determining a frequency of the second signal, FDIV, means for determining a divide ratio, NMEAS, based on the determined frequency of the first signal, FVCO, and the determined frequency of the second signal, FDIV, means for comparing the divide ratio, NMEAS, with a target divide ratio NDIV, and means for adjusting a divider control signal to obtain a minimum voltage level that causes NMEAS to equal NDIV.

Another aspect of the disclosure provides a frequency divider functionality detection and adjustment circuit including an auxiliary voltage controlled oscillator (VCO) coupled to a first multiplexer (MUX), the auxiliary VCO configured to generate a signal, FVCO, at a frequency higher than a maximum expected system frequency, a second MUX coupled to the first MUX, the second MUX configured to select the FVCO signal or a divider signal, FDIV, a counter coupled to the second MUX, the counter configured to selectively receive the FVCO signal and the divider signal, FDIV, the counter also configured to determine a frequency of the FDIV signal and a frequency of the FVCO signal, and a controller coupled to the counter, the controller configured to determine from the FDIV signal a measured divide ratio, NMEAS, and compare NMEAS with a target divide ratio, NDIV, the controller also configured to adjust a supply voltage provided to a programmable divider based on a measured divide ratio, NMEAS.

Another aspect of the disclosure provides a frequency divider functionality detection and adjustment circuit including a voltage controlled oscillator (VCO) configured to generate a signal, FVCO, at a frequency higher than a maximum expected system frequency, a divider configured to receive the signal, FVCO, and provide a divider signal, FDIV, a counter coupled to the VCO and the divider, the counter configured to selectively receive the signal, FVCO, and the divider signal, FDIV, and configured to determine a frequency of the divider signal, FDIV, and a frequency of the signal, FVCO, and a controller coupled to the counter, the controller configured to determine from the determined frequency of the signal, FVCO, and the determined frequency of the divider signal, FDIV, a measured divide ratio, NMEAS, and compare the measured divide ratio, NMEAS, with a target divide ratio, NDIV, the controller further configured to adjust a supply voltage provided to the divider based on the comparison of the measured divide ratio, NMEAS, and the target divide ratio, NDIV.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In a modern wireless communication device, there are a number of uses for a frequency divider. For example, a programmable divider (for example, a divide-by-N divider, also referred to as a frequency divider or programmable frequency divider) divides a VCO output frequency down to compare with the input reference in a synthesizer. Variations in process, voltage and temperature (PVT) may cause failure of the divide-by-N-divider, which may cause synthesizer unlock. This is especially critical for synthesizers used in millimeter wave (mmWave) communication systems because of the high VCO output frequency. For a frequency divider used to generate quadrature phase LO signals for the transmit and receive mixers, an LO frequency divider malfunction may affect TX/RX functionality as well when PVT varies. It is possible to raise the supply voltage to a frequency divider to make it more robust, but raising the supply voltage for a frequency divider that may not be susceptible to such failure unnecessarily consumes excess power.

Exemplary embodiments of the disclosure are directed to a frequency divider functionality detection and adjustment system and method that may be used to increase frequency divider performance over a range of expected PVT variations.

Figure 1:
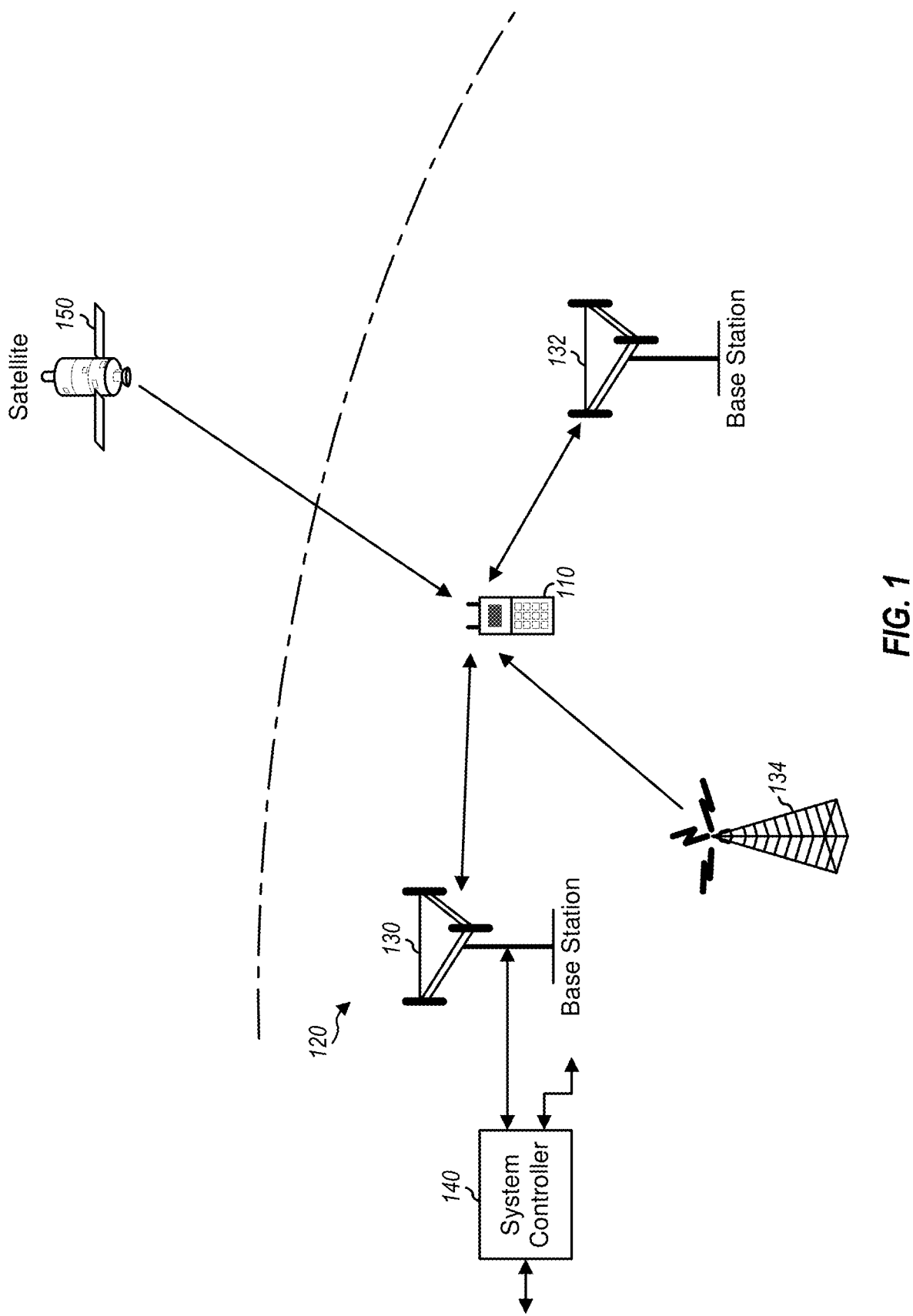
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, 5G, Bluetooth etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G, Bluetooth, or other communication bands, over a wide range of frequencies. Wireless device 110 may additionally or alternatively be capable of communicating directly with other wireless devices without communicating through a network.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
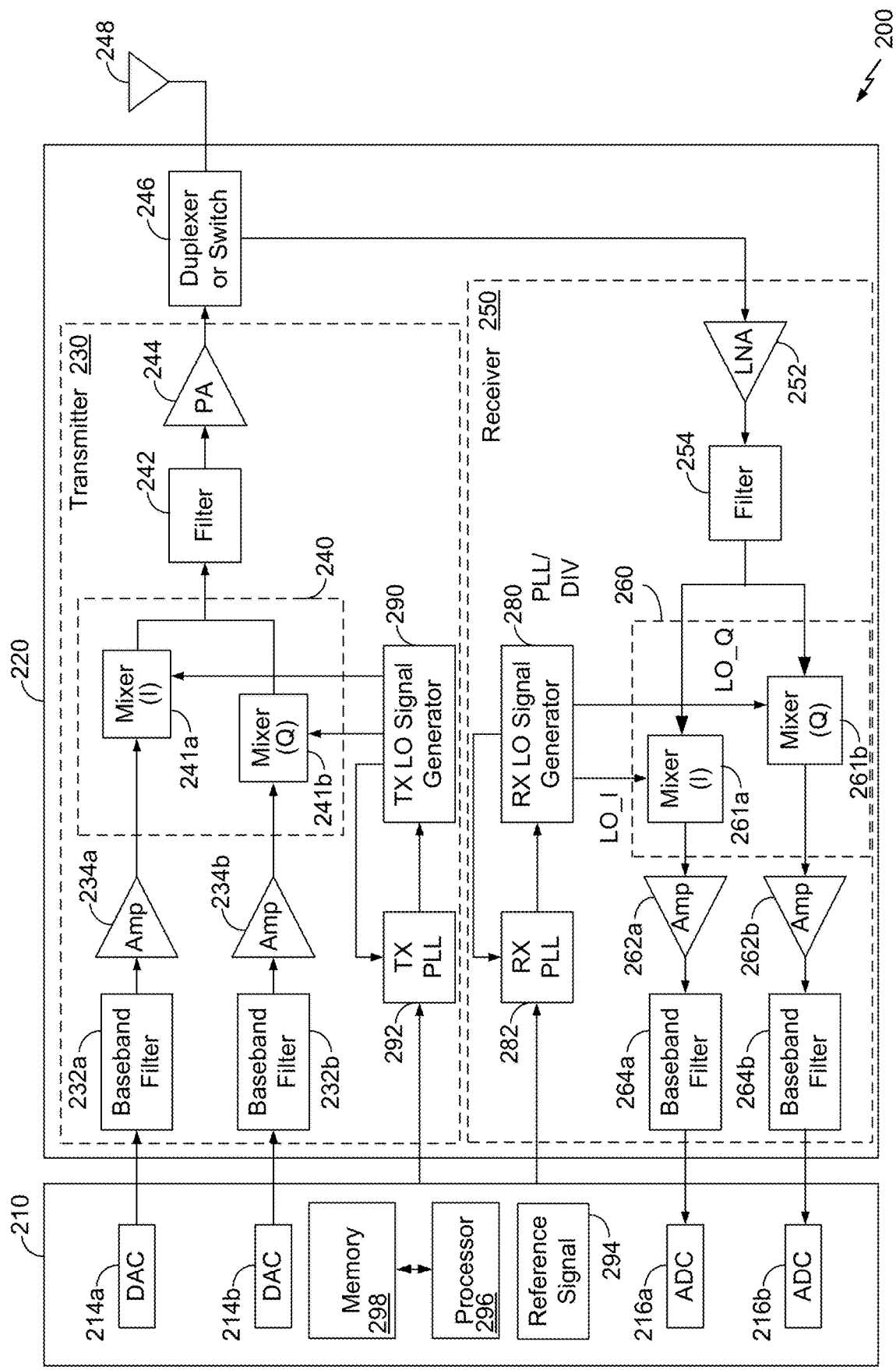
FIG. 2 is a block diagram showing a wireless device in which the exemplary techniques of the present disclosure may be implemented.

FIG. 2 is a block diagram showing a wireless device 200 in which exemplary techniques of the present disclosure may be implemented. The wireless device 200 may, for example, be an embodiment of the wireless device 110 illustrated in FIG. 1.

FIG. 2 shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, wireless device 200 generally comprises the transceiver 220 and a data processor 210. The data processor 210 may include a processor 296 operatively coupled to a memory 298. The memory 298 may be configured to store data and program codes, and may generally comprise analog and/or digital processing elements. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, baseband (e.g., lowpass) filters 232a and 232b filter the I and Q analog transmit signals, respectively, to remove undesired images caused by the prior digital-to-analog conversion. Amplifiers (Amp) 234a and 234b amplify the signals from baseband filters 232a and 232b, respectively, and provide I and Q baseband signals. An upconverter 240 upconverts the I and Q baseband signals (for example using mixers 241a and 241b) with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer or switch 246 and transmitted via an antenna 248. While examples discussed herein utilize I and Q signals, those of skill in the art will understand that elements of the transceiver may be configured to utilize polar modulation.

In the receive path, antenna 248 receives communication signals and provides a received RF signal, which is routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Down-conversion mixers 261a and 261b in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by baseband (e.g., lowpass) filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

In an exemplary embodiment, a reference signal element 294 may be located in the data processor 210 or elsewhere in the wireless device 200 and be configured to provide a reference signal to the RX PLL 282 and the TX PLL 292. In some embodiments, a reference signal element 294 is implemented separate from the data processor 210 and/or is configured to generate a reference signal based on a signal from an oscillator, for example a crystal oscillator.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain elements of the transceiver 220 are functionally illustrated in FIG. 2, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules. For example, the power amplifier 244, the filter 242, and the duplexer 246 may be implemented in separate modules or as discrete components, while the remaining elements illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide linearity, efficiency, or a combination of linearity and efficiency.

Figure 3:
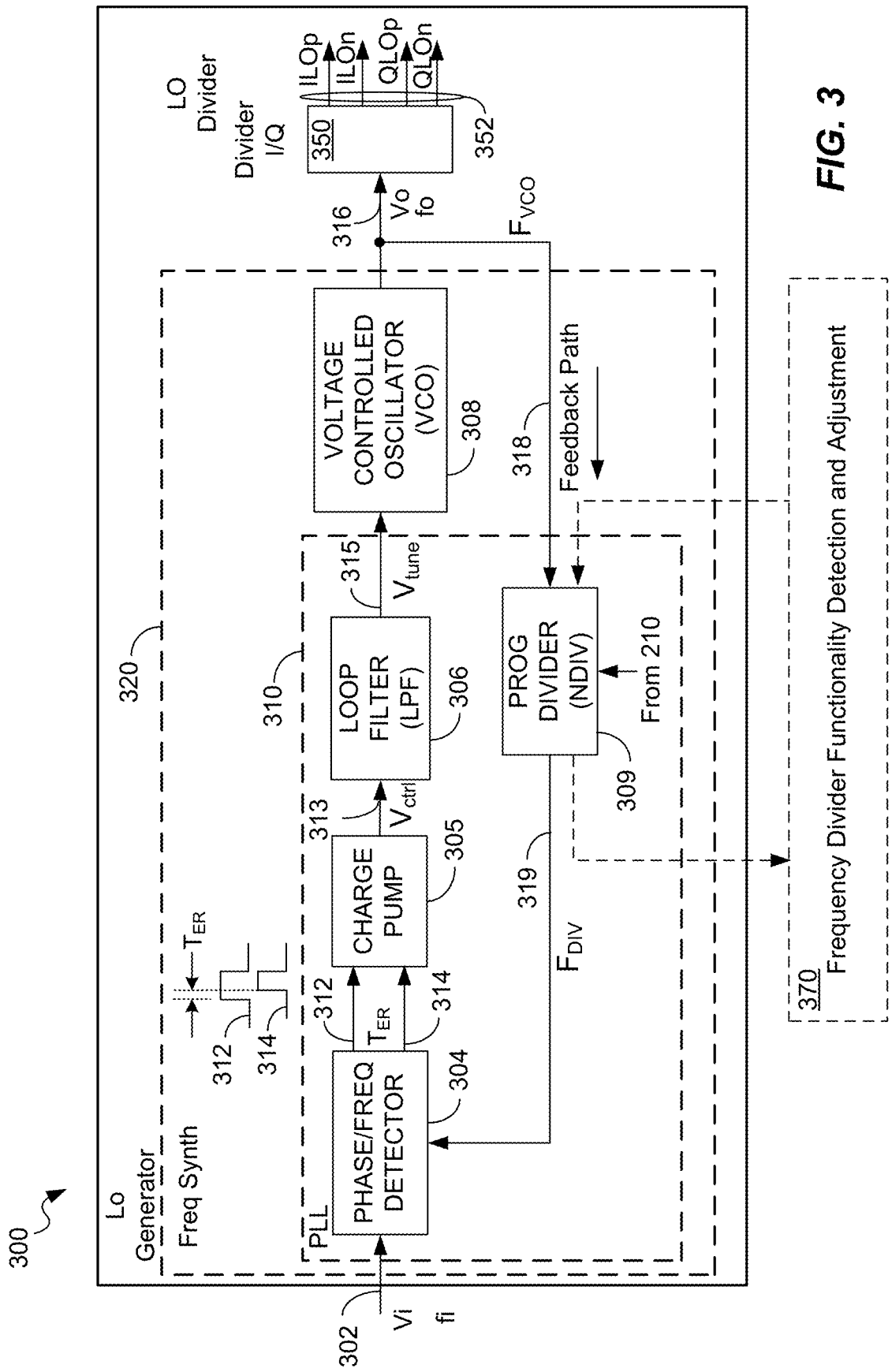
FIG. 3 is a block diagram of a local oscillator (LO) generator circuit of FIG. 2.

FIG. 3 is a block diagram of an LO generator circuit 300. In an exemplary embodiment, the LO generator circuit may be similar to either of the LO generators 280, 290. In an exemplary embodiment, the LO generator circuit 300 may generate both TX LO signals and RX LO signals, or may generate only TX LO signals or only RX LO signals. In an exemplary embodiment, the LO generator circuit 300 may comprise a frequency synthesizer 320 having a PLL circuit 310 and a voltage-controlled oscillator (VCO) 308. The LO generator circuit 300 may also comprise an LO divider 350. In an exemplary embodiment, the LO divider 350 may be a "divide-by-two" (DIV/2 or DIV2) divider that may be configured to generate in-phase and quadrature LO signals.

In an exemplary embodiment, the PLL circuit 310 includes a phase/frequency detector (PFD) 304, a charge pump 305, a loop filter 306, and a feedback circuit, which may comprise a programmable divider (NDIV) 309. In an exemplary embodiment, the loop filter 306 may be a low pass filter (LPF). The programmable divider (NDIV) 309 may be an integer-N divider or a fractional-N divider, and may also be referred to as a PLL divider.

An input signal Vi with an input phase and frequency fi is provided over connection 302 to the phase/frequency detector 304. In an exemplary embodiment, the phase/frequency detector 304 may comprise a comparator, or other circuitry, which compares the input phase and frequency on connection 302 with a feedback signal based on an output voltage signal, Vo, after processing by the programmable divider 309 on connection 319. The phase/frequency detector 304 provides two signals on connections 312 and 314 where the difference in time between the rising edges of the signals on connections 312 and 314 represents the timing error, $T_{ER}$, representing the phase and/or frequency difference between the input signals on connections 302 and 319. In an exemplary embodiment, the phase/frequency detector 304 compares the input phase on connections 302 and 319 and converts the phase difference into a timing error, $T_{ER}$, which can be represented by the amount of time occurring between two rising edges of two signals on connections 312 and 314. The timing error, $T_{ER}$, is then provided over connections 312 and 314 to the charge pump 305. The charge pump 305 then converts the timing error, $T_{ER}$, into a control voltage, $V_{ctrl}$. In response to the timing error signal, the charge pump 305, which may operate as a time-to-voltage converter, raises or lowers the DC voltage on connection 313 based on whether the timing error, $T_{ER}$, is increasing or decreasing, and generates the control voltage, $V_{ctrl}$, on connection 313. If the timing error, $T_{ER}$, is zero (0), then the output of the charge pump 305 is constant. The output of the charge pump 305 is provided over connection 313 to the loop filter 306. In an exemplary embodiment, the phase/frequency detector 304 and the charge pump 305 may be combined in a single functional block. In an exemplary embodiment where the loop filter 306 is a low pass filter, the loop filter 306 removes high frequency noise from the output signal of the charge pump 305 on connection 313 and provides a steady DC level VCO tuning voltage $V_{tune}$, on connection 315.

The DC voltage $V_{tune}$ is then provided to the VCO/buffer 308. The frequency (fo) of the output of VCO/buffer 308 is directly proportional to the input signal, Vi. Both the input phase and frequency, fi, and output phase and frequency, fo, are compared and adjusted through the feedback path 318 until the output frequency, fo, equals the input frequency, fi, multiplied by a divide ratio. The programmable divider 309 may be programmable by, for example, the data processor 210 of FIG. 2, with a signal representing a divide ratio to provide a divide-by-N function (NDIV).

The output of the frequency synthesizer 320 on connection 316 is provided to the LO divider 350. In an exemplary embodiment, the LO divider 350 may be a divide-by-two (DIV/2) circuit configured to reduce the frequency of the signal in connection 316 by a factor of two (2). Further, the LO divider may be configured to generate in-phase and quadrature signals separated by 90 degrees. Other divide ratios are possible. In some embodiments, the LO generator circuit 300 may not include the LO divider 350, and the output of the LO generator circuit 300 may be provided by the VCO 308.

In an exemplary embodiment, the LO divider 350 divides the VCO signal on connection 316 in frequency and provides four divided signals comprising ILOp, ILOn, QLOp and QLOn signals on connection 352, which are 90 degrees out of phase with respect to each other. In general, a differential signal comprises a non-inverting signal denoted by a suffix "p" and a complementary inverting signal denoted by a suffix "n". The ILOp and ILOn signals may be provided to a mixer 261a and/or 241a (FIG. 2) and the QLOp and QLOn signals may be provided to a mixer 261b and/or 241b (FIG. 2). Other divider ratios are possible, with a quadrature divider described for illustrative purposes only.

In an exemplary embodiment, the wireless device 110 may support communication with wireless systems utilizing TDD and/or FDD. For TDD, the downlink and uplink share the same frequency, and downlink transmissions and uplink transmissions may be sent on the same frequency in different time periods. For FDD, the downlink and uplink are allocated separate frequencies. Downlink transmissions may be sent on one frequency, and uplink transmissions may be sent on another frequency. Some exemplary radio technologies supporting TDD include LTE TDD, TD-SCDMA, and GSM. Some exemplary radio technologies supporting FDD include LTE FDD, WCDMA, and CDMA 1x.

Exemplary embodiments of a frequency divider functionality detection and adjustment system and method may be used to increase or optimize the performance and power consumption of the programmable divider 309, the LO divider 350, or another divider circuit. In an exemplary embodiment, a frequency divider functionality detection and adjustment circuit 370 may be implemented to adjust the programmable divider 309 when calibrating the frequency synthesizer 320. Alternatively, the frequency divider functionality detection and adjustment circuit 370 may be implemented to adjust operation of the LO divider 350, or another frequency divider circuit. In an exemplary embodiment, the frequency divider functionality detection and adjustment circuit 370 is shown in FIG. 3 in dotted line to indicate that it is not necessarily part of the LO generator 300, but can be implemented during operational testing and calibration of one or more frequency dividers that may be part of the LO generator 300. In an exemplary embodiment, the frequency divider functionality detection and adjustment circuit 370 may be used to establish a worst case temperature operating condition to optimize or otherwise adjust the operation of the programmable divider 309, LO divider 350, or other frequency divider circuitry, to anticipate variations of divider operation based on PVT variations.

The techniques described herein may be used to optimize or otherwise adjust the operation of a frequency divider, such as the programmable divider 309, the LO divider 350, or another divider circuit, to efficiently operate, for example in order to ensure operation over an expected range of temperature, while reducing power consumption and conserving battery power. Exemplary embodiments may be used for a frequency divider for a receiver as well as a frequency divider for a transmitter.

Figure 4:
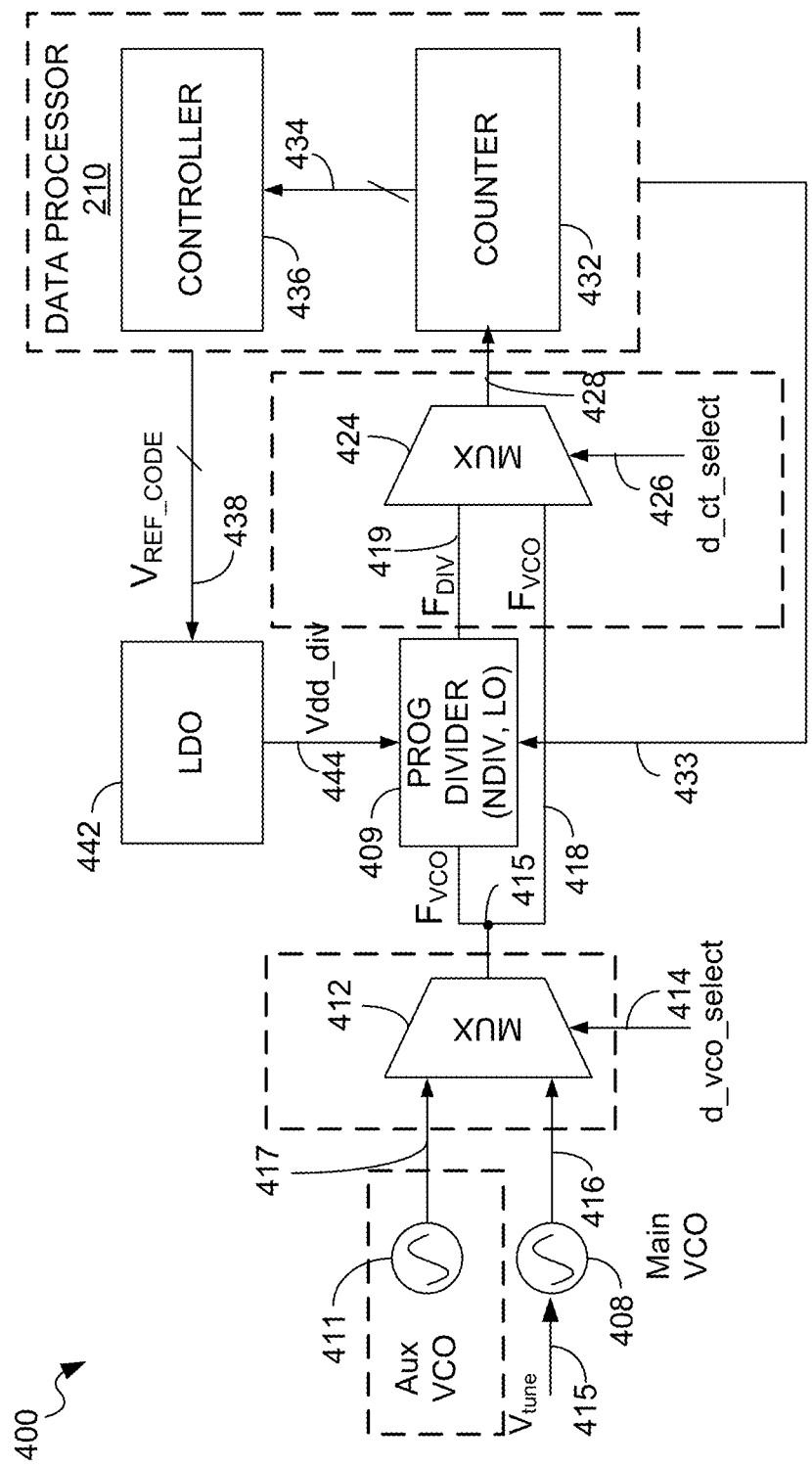
FIG. 4 is a block diagram of a frequency divider functionality detection and adjustment circuit.

FIG. 4 is a block diagram of a frequency divider functionality detection and adjustment circuit 400. In an exemplary embodiment, the frequency divider functionality detection and adjustment circuit 400 may be an example of the frequency divider functionality detection and adjustment circuit 370 shown in FIG. 3. In FIG. 4, some of the elements are similar to elements in FIG. 3 and those elements in FIG. 4 will be numbered using the convention 4XX, where an element in FIG. 4 labeled 4XX is similar to an element labeled 3XX in FIG. 3.

In an exemplary embodiment, the frequency divider functionality detection and adjustment circuit 400 is shown in FIG. 4 as being used with a programmable divider 409, which is similar to the programmable divider 309 of FIG. 3; however, the frequency divider functionality detection and adjustment circuit 400 can be used with any divider circuit.

In an exemplary embodiment, the frequency divider functionality detection and adjustment circuit 400 includes an auxiliary VCO 411, a first multiplexer (MUX) 412, a second MUX 424, a low dropout (LDO) voltage regulator 442 and the data processor 210 (FIG. 2). In an exemplary embodiment, a counter 432 (e.g., a coarse tune counter) and a controller 436 represent functionality in the data processor 210 that is used with the frequency divider functionality detection and adjustment circuit 400. In other examples, the counter 432 and/or the controller 436 are implemented partially or wholly separate from the processor 210, for example in a transceiver circuit. Thus, in exemplary embodiments, the controller 436 and the counter 432 are elements that may reside in the data processor 210 or elsewhere in the wireless device 200 (FIG. 2). The LDO voltage regulator 442 typically provides a supply voltage to the programmable divider 409 and is shown in FIG. 4 as part of the frequency divider functionality detection and adjustment circuit 400 for convenience. In an exemplary embodiment, the LDO voltage regulator 442, the counter 432 and the controller 436 may be part of a communication device, such as the wireless device 200 of FIG. 2, and are reused for the frequency divider functionality detection and adjustment circuit 400. Also shown for reference in FIG. 4 are a VCO 408 and a programmable divider 409. In an exemplary embodiment, the VCO 408 is similar to the VCO 308 in FIG. 3 and the programmable divider 409 is similar to the programmable divider 309 of FIG. 3.

In an exemplary embodiment, both the VCO 408 and the auxiliary VCO 411 are coupled to the first multiplexer (MUX) 412. The first MUX 412 may receive a control signal, d_vco_select over connection 414 from, for example, the data processor 210 of FIG. 2.

In an exemplary embodiment, the VCO 408 may be similar to the VCO 308 of FIG. 3 and in a mmWave communication system may be configured to provide a system signal at an approximate frequency of 21.5 GHz on connection 416. In some such examples, this frequency is approximately twice an intermediate frequency in a superheterodyne mmWave communication system, such that the divider 350 outputs a signal having approximately the intermediate frequency. In an exemplary embodiment, the auxiliary VCO 411 may be configured to provide a signal on connection 417 at a frequency that is approximately 10% to 15% higher than the frequency of the system signal provided by the VCO 408. For example, in a mmWave communication system where the output frequency of the VCO 408 is approximately 21.5 GHz, the auxiliary VCO 411 may be configured to provide a signal at a frequency of approximately 23-24 GHz.

An output of the first MUX 412 may be provided to a node 415. The node 415 may be coupled to the programmable divider 409 and to the second MUX 424. For example, depending on the state of the d_vco_select signal on connection 414, either the output of the VCO 408 or the output of the auxiliary VCO 411 may be provided to the node 415. The signal at the node 415 may be referred to as $F_{VCO}$, regardless of whether the output of the VCO 408 or the output of the auxiliary VCO 411 is provided to the node 415.

In an exemplary embodiment, the programmable divider 409 receives a divide ratio control signal from the data processor 210 over connection 433, and receives a supply voltage, Vdd_div, from the LDO voltage regulator 442 over connection 444. The control signal on connection 433 from the data processor 210 determines the divide ratio at which the programmable divider 409 operates to divide the signal on node 415, and determines the frequency, $F_{DIV}$, of the signal on connection 419. A control signal, $V_{REF\_CODE}$, on connection 438 from the data processor 210 determines the output voltage of the LDO voltage regulator 442. The LDO voltage regulator 442 receives the control signal, $V_{REF\_CODE}$, and develops the supply voltage, Vdd_div, provided to the programmable divider 409 over connection 444. The relationship between the control signal, $V_{REF\_CODE}$, and the supply voltage, Vdd_div, may be proportional. For example, the control signal, $V_{REF\_CODE}$, may be a digital control signal where an increment of one (1) corresponds to a voltage change of the supply voltage, Vdd_div, for example, of 5 mV-7 mV. The control signal, $V_{REF\_CODE}$, can be incremented by for example, +1 with a corresponding increase in the supply voltage, Vdd_div, of, for example, 5 mV-7 mV, or can be decremented by for example −1 with a corresponding decrease in the supply voltage, Vdd_div, of, for example, 5 mV-7 mV. Other proportions of $V_{REF\_CODE}$, increment to supply voltage change are also possible with 5 mV to 7 mV described for example only.

In an exemplary embodiment, the second MUX 424 is controlled by a signal, d_ct_select on connection 426. In an exemplary embodiment, the d_ct_select on connection 426 may be provided by the data processor 210.

The state of the d_ct_select on connection 426 determines whether the output of the second MUX on connection 428 is the $F_{DIV}$ signal on connection 419 or the $F_{VCO}$ signal on connection 418.

In an exemplary embodiment where the output of the first MUX 412 at node 415 is the $F_{VCO}$ signal, from either the VCO 408 or the auxiliary VCO 411, then depending on the state of the d_ct_select on connection 426, either the $F_{VCO}$ signal on connection 418 or the $F_{DIV}$ output of the programmable divider 409 on connection 419 will be provided over connection 428 to the counter 432.

In an exemplary embodiment, the counter 432 counts (or measures) the frequency of the signal on connection 428 and provides a counter signal over connection 434 that represents the frequency of the signal on connection 428. In an exemplary embodiment, the controller 436 receives the counter signal on connection 434 and based thereon develops the control signal, $V_{REF\_CODE}$, on connection 438 that ultimately determines the voltage provided by the LDO voltage regulator 442 on connection 444 to the programmable divider 409. In an exemplary embodiment, the supply voltage Vdd_div on connection 444 is set by the controller 436 to achieve the divide ratio determined, or set, by the data processor 210 and provided to the programmable divider 409 over connection 433.

In an exemplary embodiment, the auxiliary VCO 411 is enabled and set to provide an output signal at a frequency higher than a maximum expected frequency, $F_{MAX}$, than is expected from the VCO 408. For example, if the maximum frequency that the VCO 408 is expected to provide is 21.5 GHz, then the frequency of the auxiliary VCO 411 may be set to, for example, 23-24 GHz. In an exemplary embodiment, setting the auxiliary VCO to a frequency greater than $F_{MAX}$ allows the programmable divider 409 to be tested and corrected at an ambient temperature (e.g., such as room temperature), while ensuring that the programmable divider 409 will operate at the desired frequency across all expected operating temperatures. Such operation at a frequency higher than $F_{MAX}$ may be considered a "worst case" operation so if the programmable divider 409 can operate at a frequency greater than $F_{MAX}$ then it will operate at its normal desired frequency during regular operation with a reduced sensitivity to variations due to PVT.

While the auxiliary VCO 411 is providing the higher than $F_{MAX}$ output, the counter 432 alternatively measures the output frequency, $F_{VCO}$, of the auxiliary VCO 411 at node 415 and the output frequency, $F_{DIV}$, of the programmable divider 409 on connection 419. For example, initially the first MUX 412 selects the output of the auxiliary VCO 411 and the second MUX 424 selects the $F_{VCO}$ signal on connection 418 so that the counter 432 initially measures the frequency of the output, $F_{VCO}$ of the auxiliary VCO 411. This value may be stored in the controller 436 as a first value, N1. Then, while the $F_{VCO}$ signal on node 415 still represents the output of the auxiliary VCO 411, the programmable divider 409 divides the $F_{VCO}$ signal at node 415 and provides its output as the $F_{DIV}$ signal on connection 419. Then, the second MUX selects the $F_DIV$ input on connection 419 so that the $F_{DIV}$ signal appears on connection 428. The counter 432 then measures the frequency of the $F_{DIV}$ signal on connection 428. This value may be stored in the controller 436 as a second value, N2. For example, the processor 296 and the memory 298 (FIG. 2) may be used to perform the calculation and store the results for N1 and N2. Both the measured frequency of the output, $F_{VCO}$ of the auxiliary VCO 411 (N1) and the measured frequency of the $F_{DIV}$ signal provided by the programmable divider 409 (N2) are provided from the counter 432 to the controller 436 over connection 434. The controller 436 calculates the divide ratio (N1/N2) provided by the programmable divider 409 by comparing the FDIV signal with the $F_{VCO}$ signal to determine a measured divide ratio, $N_{MEAS}$. For example, if the divide ratio is desired to be two (2), if the frequency, $F_{VCO}$, of the signal provided by the auxiliary VCO 411 is 24 GHz and the frequency, $F_{DIV}$, of the programmable divider 409 is 12 GHz, then it is clear that the programmable divider 409 is operating as a divide-by-two divider.

The measured divide ratio, $N_{MEAS}$, is then compared with a signal representing a target divide ratio, $N_{DIV}$. Using the example of a divide-by-two divide ratio, an expected target divide ratio is two, and in this example, the measured divide ratio equals the target divide ratio.

If the measured divide ratio differs from the target divide ratio, then the voltage provided by the LDO voltage regulator may be increased. For example, the measured divide ratio, $N_{MEAS}$, may be less than or greater than the target divide ratio, $N_{DIV}$, indicating that the programmable divider 409 fails to provide the target divide ratio and accordingly the voltage provided to the programmable divider is increased. If the measured divide ratio equals the target divide ratio, then the voltage provided by the LDO voltage regulator may be decreased until the measured divide ratio differs from the target divide ratio. In an exemplary embodiment, the frequency divider functionality detection and adjustment circuit 400 operates to determine the minimum supply voltage at which the programmable divider 409 will provide the target divide ratio. In an exemplary embodiment, the minimum supply voltage may be determined by determining if the programmable divider 409 fails to operate at the target divide ratio at the initial frequency of $F_{MAX}$, and if so, increasing the supply voltage until the programmable divider 409 operates at the target divide ratio at the initial frequency of $F_{MAX}$. If the programmable divider 409 operates at the target divide ratio at the initial frequency of $F_{MAX}$, then the supply voltage is decreased until the programmable divider 409 fails to operate at the target divide ratio at the initial frequency of $F_{MAX}$. In this manner, the voltage provided by the LDO voltage regulator can be minimized, while ensuring that the programmable divider 409 provides its target output over a range of expected temperature and process variation.

Figure 5:
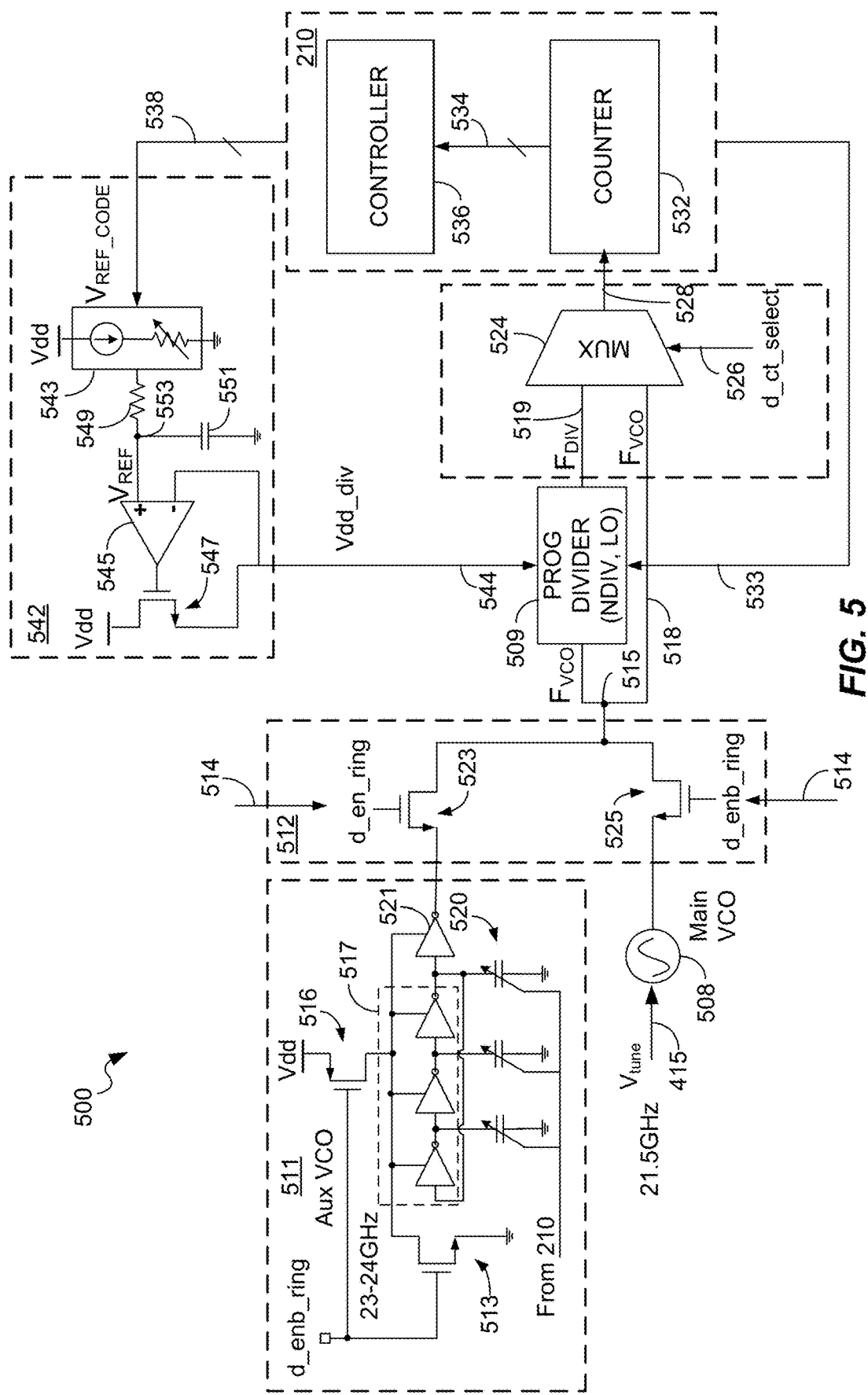
FIG. 5 is a block diagram showing an exemplary embodiment of the frequency divider functionality detection and adjustment circuit of FIG. 4.

FIG. 5 is a block diagram 500 showing an exemplary embodiment of the frequency divider functionality detection and adjustment circuit of FIG. 4. In FIG. 5, some of the elements are similar to elements in FIG. 4 and those elements in FIG. 5 will be numbered using the convention 5XX, where an element in FIG. 5 labeled 5XX is similar to an element labeled 4XX in FIG. 4.

In an exemplary embodiment, an auxiliary VCO 511 may be implemented using a ring oscillator to generate the frequency that is higher than $F_{MAX}$. As its name implies, a ring oscillator is a device comprising an odd number of inverters 517 arranged in a ring architecture, the output of which oscillates between two voltage levels, representing true and false, or logic 1 and logic 0. The inverters 517 are coupled in a chain and the output of the last inverter is fed back into the first inverter. An inverter 521 may be used to provide the output signal to the first MUX 512. Capacitors 520 may be coupled to respective outputs of inverters 517. In an exemplary embodiment, the capacitors 520 may be adjustable based on a control signal provided by the data processor 210, and may be adjusted to control the output frequency of the auxiliary VCO 511. A source of a transistor 516 may be coupled to a system voltage, Vdd. The transistor 516 may receive an enable signal, d_enb_ring, at its gate and may have a drain coupled to the inverters 517 and 521.

A drain of a transistor 513 may be coupled to the drain of the transistor 516 and to the inverters 517 and 521, a source of the transistor 513 may be coupled to system ground, and a gate of the transistor 513 may receive the enable signal, d_enb_ring.

In an exemplary embodiment, the first MUX 512 may comprise transistors 523 and 525. The transistor 523 may have its source coupled to the output of the inverter 521 and the transistor 525 may have its source coupled to the output of the VCO 508. An enable signal, d_en_ring, may be coupled to the gate of the transistor 523 and the enable signal, d_enb_ring, may be coupled to the gate of the transistor 525. The signals d_en_ring and d_enb_ring are complementary, so that when the transistor 523 is on, the transistor 525 is off and when the transistor 525 is on the transistor 523 is off.

Depending on the state of the enable signals, d_en_ring and d_enb_ring, either the output of the auxiliary VCO 511 or the output of the VCO 508 will be provided to the node 515.

In an exemplary embodiment, the LDO voltage regulator 542 may comprise a reference voltage generator 543, an operational amplifier (OpAmp) 545, a transistor 547 a resistor 549 and a capacitor 551. The reference voltage generator 543 may be configured to receive the output of the data processor 210 over connection 538, and develop a reference voltage, $V_{REF}$ across the resistor 549 and capacitor 551 at the node 553. The reference voltage, $V_{REF}$ may be provided to the non-inverting input of the OpAmp 545. An output of the OpAmp 545 is provided to the gate of the transistor 547. The drain of the transistor 547 may be coupled to a system voltage, Vdd, and a source of the transistor 547 may provide the Vdd_div supply voltage to the programmable divider 509. The signal at the source of the transistor 547 is also fed back to the inverting input of the OpAmp 545. The source of the transistor 547 provides the Vdd_div supply voltage to the programmable divider 509 over connection 544.

Figure 6:
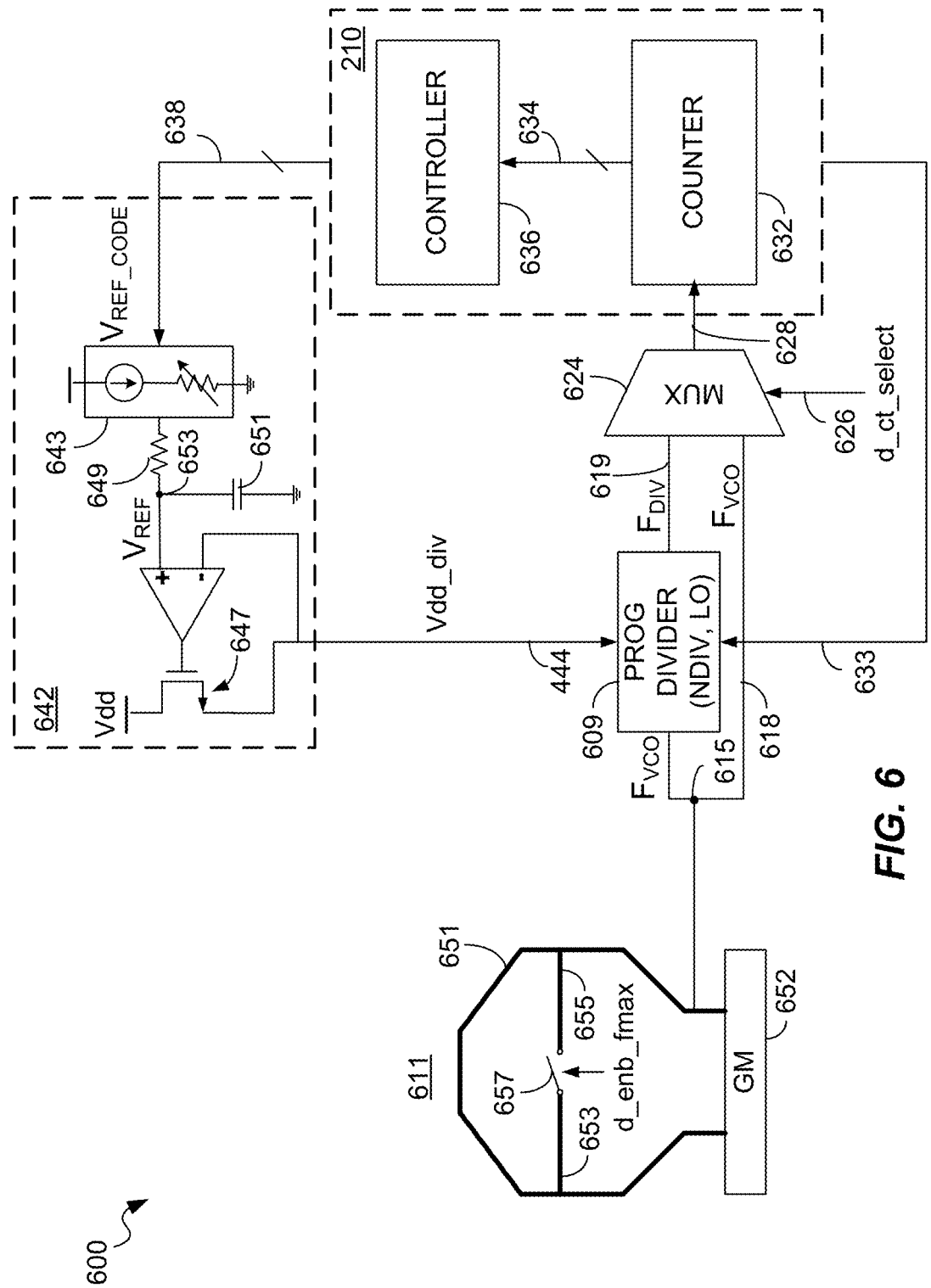
FIG. 6 is a block diagram showing an alternative exemplary embodiment of the frequency divider functionality detection and adjustment circuit of FIG. 5.

FIG. 6 is a block diagram 600 showing an alternative exemplary embodiment of the frequency divider functionality detection and adjustment circuit of FIG. 5. In FIG. 6, some of the elements are similar to elements in FIG. 5 and those elements in FIG. 6 will be numbered using the convention 6XX, where an element in FIG. 6 labeled 6XX is similar to an element labeled 5XX in FIG. 5.

In an exemplary embodiment, a VCO 611 may be implemented that may have the capability of providing multiple frequency outputs. For example, in a first mode, the VCO 611 may be configured to provide a first output frequency, such as 21.5 GHz. Then, in a second mode, the VCO 611 may be configured to provide a second output frequency that is approximately 10% to 15% higher than the first output frequency, such as, for example, 23-24 GHz.

In an exemplary embodiment, the VCO 611 may be implemented as a one (1) turn inductive-capacitive (LC) VCO having an active portion, such as a gm stage 652, and a first inductor portion 651. In an exemplary embodiment, the VCO 611 may also comprise second inductor portion 653 and a third inductor portion 655, each coupled to the first inductor portion 651 and to a switch 657. In an exemplary embodiment, the switch 657 may be controlled by a control signal, d_enb_fmax, provided by the data processor 210.

In an exemplary embodiment, in a first mode, the VCO 611 may be configured to use the gm stage 652 and the first inductor portion 651 (with the switch 657 non-conductive) to provide a system signal at a first output frequency, $F_{MAX}$, such as 21.5 GHz. Then, in a second mode, the VCO 611 may be configured to use the gm stage 652, the first inductor portion 651, the second inductor portion 653 and the third inductor portion 655 (with the switch 657 conductive) to provide an auxiliary system signal at a second output frequency that is approximately 10% to 15% higher than the first output frequency, that is greater than $F_{MA}X$, such as, for example, 23-24 GHz.

Either the first output frequency or the second output frequency may be selectively provided to the node 615 as described above depending on the operation of the VCO 611.

Figure 7:
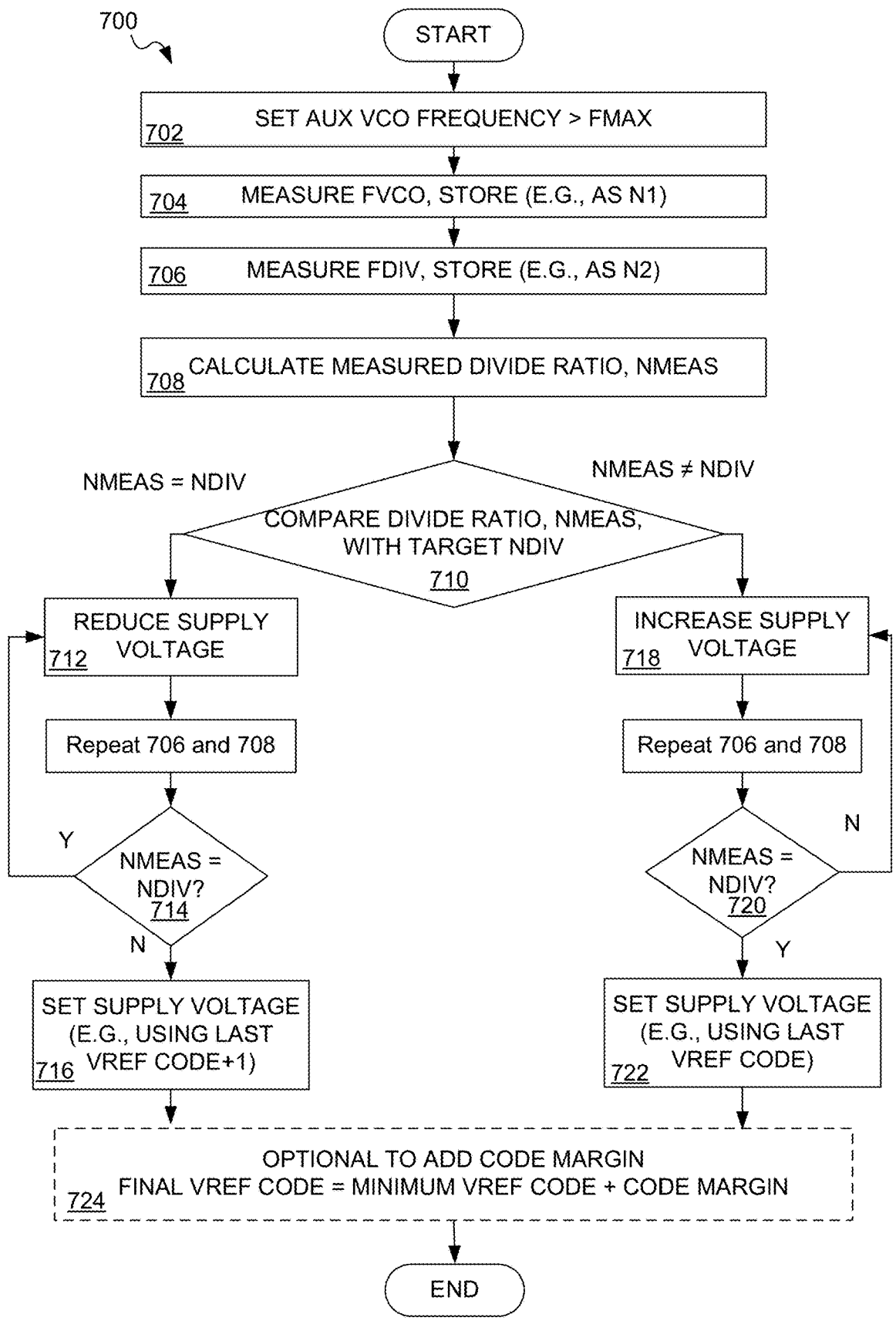
FIG. 7 is a flow chart describing an example of a method for frequency divider functionality detection and adjustment in accordance with an exemplary embodiment of the disclosure.

FIG. 7 is a flow chart 700 describing an example of the operation of a method for frequency divider functionality detection and adjustment. The blocks in the method 700 can be performed in or out of the order shown, and in some embodiments, can be performed at least in part in parallel.

In block 702, the auxiliary VCO is set to a frequency greater than $F_{MAX}$. In an exemplary embodiment, the auxiliary VCO 411, the auxiliary VCO 511 or the VCO 611 may be set to an operating frequency higher than the highest expected VCO frequency. For example, the auxiliary VCO 411, the auxiliary VCO 511, or the VCO 611 may be set to operate at, for example, 23-24 GHz. In an exemplary embodiment, setting the auxiliary VCO to a frequency greater than $F_{MAX}$ allows the programmable divider to be tested and corrected at an ambient temperature (e.g., such as room temperature) to ensure that the programmable divider will operate at the desired frequency across all temperatures. As an example, ambient temperature may be on the order of 70 degrees Fahrenheit. Such operation at this frequency higher than $F_{MAX}$ may be considered a "worst case" operation.

In block 704, the auxiliary VCO output is measured. For example, the counter 432 may initially measure the frequency of the output, $F_{VCO}$ of the auxiliary VCO 411. This value may be stored in the controller 436 as a first value, N1. Step 704 may be performed using the last value for N1 captured by the counter 432 in a coarse tune step during an initial start-up of the PLL. As alluded to above, the measured frequency need not be an absolute frequency, such as a value in Hz. The frequency can be a count of pulses or edges, or any other measurement or indication representative of the frequency of a signal.

In block 706, the programmable divider output is measured. For example, while the $F_{VCO}$ signal on node 415 still represents the output of embodiments of the auxiliary VCO 411, the programmable divider 409 divides the $F_{VCO}$ signal at node 415 and provides its output as the $F_{DIV}$ signal on connection 419. Then, the counter 432 measures the frequency of the $F_{DIV}$ signal on connection 428. This value may be stored in the controller 436 as a second value, N2. As alluded to above, the measured frequency need not be an absolute frequency, such as a value in Hz. The frequency can be a count of pulses or edges, or any other measurement or indication representative of the frequency of a signal.

In block 708, the divide ratio, $N_{MEAS}$, of the programmable divider is calculated. For example, the controller 436 calculates the divide ratio as the integer part of (N1/N2+0.5) provided by the programmable divider 409 by comparing the $F_{DIV}$ signal with the $F_{VCO}$ signal to determine the divide ratio. Adding 0.5 to the value of N2/N1 ensures that the calculation results in an integer number closest to N1/N2.

In block 710, the measured divide ratio, $N_{MEAS}$, is compared against the target divide ratio, $N_{DIV}$. For example, the controller 436 may compare the divide ratio, $N_{MEAS}$, against the target divide ratio, $N_{DIV}$ to determine if the programmable divider is operating at the target divide ratio, $N_DIV$. To detect and optimize or otherwise adjust the divider functionality at the worst case operating condition, the divide ratio, $N_{DIV}$, is set to a value that corresponds to the highest supply voltage, Vdd_div, from the LDO voltage regulator 442.

If the measured divide ratio, $N_{MEAS}$, is equal to the target divide ratio, $N_{DIV}$, then in block 712 the supply voltage provided by the LDO voltage regulator 442 (FIG. 4) is decreased by decreasing the control signal, $V_{REF\_CODE}$ provided on connection 438 is decreased by 1.

Blocks 706 and 708 are then repeated using the decreased supply voltage.

In block 714, it is determined whether the measured divide ratio, $N_{MEAS}$, is equal to the target divide ratio, $N_{DIV}$. If it is determined in block 714 that the measured divide ratio, $N_{MEAS}$, is equal to the target divide ratio, $N_{DIV}$, then the process returns to block 712 and repeats. If it is determined in block 714 that the measured divide ratio, $N_{MEAS}$, does not equal to the target divide ratio, $N_{DIV}$, then the process proceeds to block 716.

In block 716, the minimum value for the control signal, $V_{REF\_CODE}$ that corresponds to a supply voltage, Vdd_div, that allows the programmable divider 409 (FIG. 4) to operate at its target divide ratio is set, for example by setting the control signal, $V_{REF\_CODE}$ equal to the last code+1, which corresponds to a supply voltage, Vdd_div, that is the equivalent of one code increment higher than the supply voltage set in block 712.

If it is determined in block 710 that the measured divide ratio, $N_{MEAS}$, is unequal to the target divide ratio, $N_{DIV}$, then in block 718 the supply voltage provided by the LDO voltage regulator 442 (FIG. 4) is increased by incrementing the control signal, $V_{REF\_CODE}$ by 1.

Blocks 706 and 708 are then repeated using the increased supply voltage.

In block 720, it is determined whether the measured divide ratio, $N_{MEAS}$, is Still not equal to the target divide ratio, $N_{DIV}$. If it is determined in block 720 that the measured divide ratio, $N_{MEAS}$, is not equal to the target divide ratio, $N_{DIV}$, then the process returns to block 718 and repeats. If it is determined in block 720 that the measured divide ratio, $N_{MEAS}$, is equal to the target divide ratio, $N_{DIV}$, then the process proceeds to block 722.

In block 722, the minimum value of the control signal $V_{REF\_CODE}$ that corresponds to a supply voltage, Vdd_div, that allows the programmable divider 409 (FIG. 4) to operate at its target divide ratio is set, for example by setting the control signal, $V_{REF\_CODE}$ equal to the last code, which corresponds to a supply voltage, Vdd_div, that is the equivalent the supply voltage set in block 718.

Optionally, in block 724, a code margin is added to the minimum value of the control signal $V_{REF\_CODE}$ to allow the programmable divider to operate robustly. The code margin can be stored in the controller 436, (or 536 or 636) and can be changeable. For example, if the code margin is 0, then the final value for $V_{REF\_CODE}$ is exactly the minimum code that makes the divider work. If the code margin is 2, the final value for $V_{REF\_CODE}$ is the minimum value of $V_{REF\_CODE}$ plus 2, which provides higher supply than needed, thus making the divider work more robustly.

Figure 8:
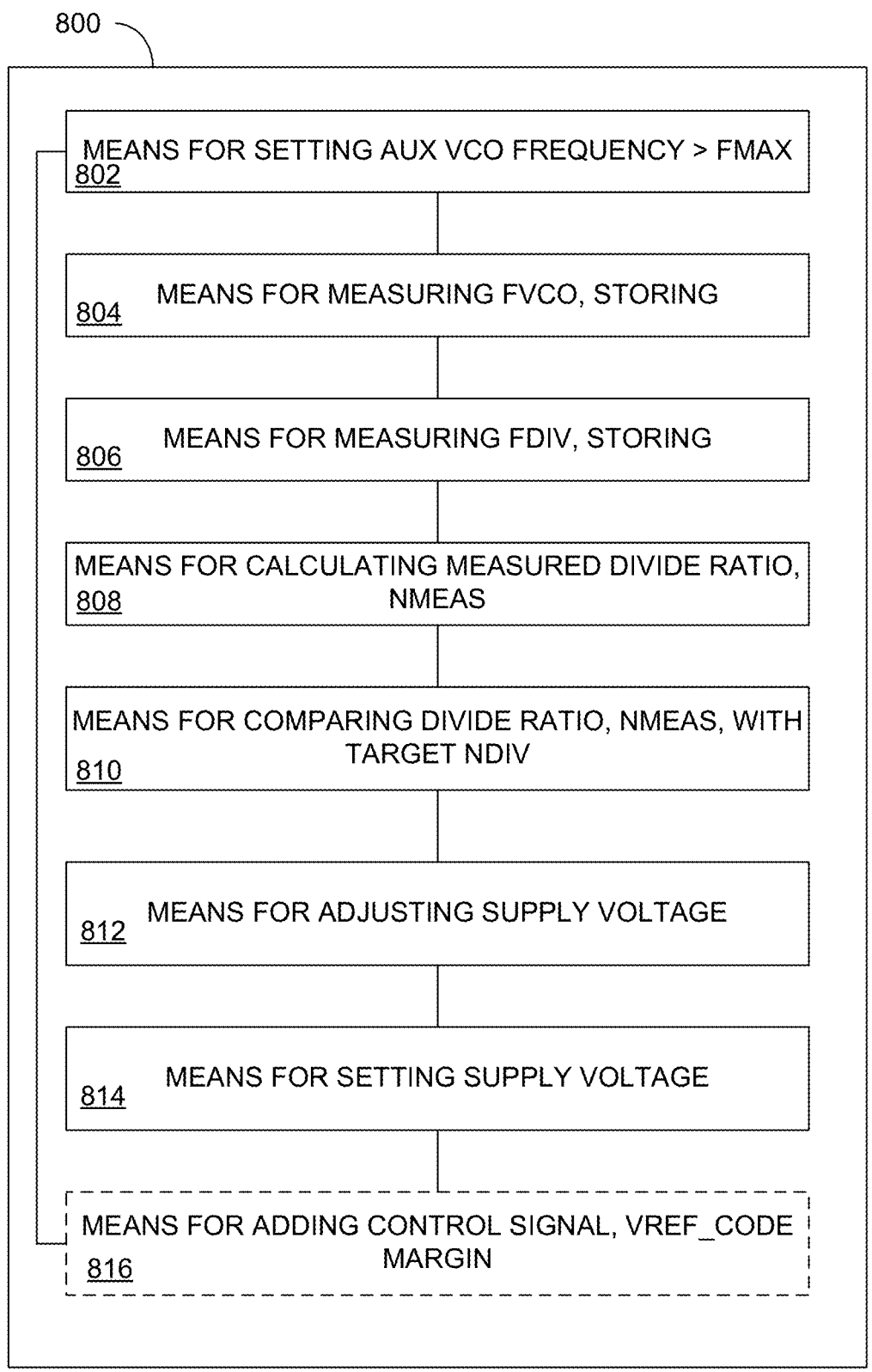
FIG. 8 is a functional block diagram of an apparatus for frequency divider functionality detection and adjustment in accordance with an exemplary embodiment of the disclosure.

FIG. 8 is a functional block diagram of an apparatus for frequency divider functionality detection and adjustment in accordance with an exemplary embodiment of the disclosure.

The apparatus 800 comprises means 802 for setting the auxiliary VCO to a frequency greater than $F_{MAX}$. In certain embodiments, the means 802 for setting the auxiliary VCO to a frequency greater than $F_{MAX}$ can be configured to perform one or more of the functions described in operation block 702 of method 700 (FIG. 7). In an exemplary embodiment, the means 802 for setting the auxiliary VCO to a frequency greater than $F_{MAX}$ may comprise the processor 210. For example, the processor 210 may be configured to set the auxiliary VCO 411, the auxiliary VCO 511 or the VCO 611 to an operating frequency higher than the highest expected frequency of the "main" VCO. For example, the auxiliary VCO 411, the auxiliary VCO 511, or the VCO 611 may be set to operate at, for example, 23-24 GHz. The means 802 may additionally or instead comprise elements of the auxiliary VCO, for example the capacitors 520 or the switch 657.

The apparatus 800 may also comprise means 804 for measuring the auxiliary VCO output. In certain embodiments, the means 804 for measuring the auxiliary VCO output can be configured to perform one or more of the functions described in operation block 704 of method 700 (FIG. 7). In an exemplary embodiment, the means 804 for measuring the auxiliary VCO output may comprise the counter 432. For example, the counter 432 may be configured to initially measure the frequency of the output, $F_{VCO}$ of the auxiliary VCO 411. This value may be stored in the controller 436 as a first value, N1. The means 804 may additionally or instead comprise elements allowing for the selection of a VCO output, for example the MUX 412, 424, 512, 524, and/or 634. The means 804 may further include the connection 418, 518, and/or 618.

The apparatus 800 may also comprise means 806 for measuring the programmable divider output. In certain embodiments, the means 806 for measuring the programmable divider output can be configured to perform one or more of the functions described in operation block 706 of method 700 (FIG. 7). In an exemplary embodiment, the means 806 for measuring the programmable divider output may comprise the counter 432. For example, the counter 432 may be configured to measure the $F_{DIV}$ signal on connection 428. This value may be stored in the controller 436 as a second value, N2. The means 806 may additionally or instead comprise elements allowing for the selection of a VCO output, for example the MUX 412, 424, 512, 524, and/or 634. The means 806 may further include the connection 419, 519, and/or 619. While illustrated separately in FIG. 8, the means 804, 806 may be partially or wholly combined.

The apparatus 800 may also comprise means 808 for calculating the divide ratio, $N_{MEAS}$, of the programmable divider. In certain embodiments, the means 808 for calculating the divide ratio, $N_{MEAS}$, of the programmable divider can be configured to perform one or more of the functions described in operation block 708 of method 700 (FIG. 7). In an exemplary embodiment, the means 808 for calculating the divide ratio, $N_{MEAS}$, of the programmable divider may comprise the controller 436. For example, the controller 436 may be configured to calculate the divide ratio as the integer part of (N1/N2+0.5) provided by the programmable divider 409 by comparing the $F_{DIV}$ signal with the $F_{VCO}$ signal to determine the divide ratio. Adding 0.5 to the value of N2/N1 may ensure that the calculation results in an integer number closest to N1/N2.

The apparatus 800 may also comprise means 810 for comparing the measured divide ratio, $N_{MEAS}$, against the target divide ratio, $N_{DIV}$. In certain embodiments, the means 810 for comparing the measured divide ratio, $N_{MEAS}$, against the target divide ratio, $N_{DIV}$ can be configured to perform one or more of the functions described in operation block 710 of method 700 (FIG. 7). In an exemplary embodiment, the means 810 for comparing the measured divide ratio, $N_{MEAS}$, against the target divide ratio, $N_{DIV}$ may comprise the controller 436. For example, the controller 436 may be configured to compare the divide ratio, $N_{MEAS}$, against the target divide ratio, $N_{DIV}$ to determine if the programmable divider is operating at the target divide ratio, $N_{DIV}$. While illustrated separately in FIG. 8, the means 808, 810 may be partially or wholly combined.

The apparatus 800 may also comprise means 812 for adjusting the supply voltage provided to the programmable divider. In certain embodiments, the means 812 for adjusting the supply voltage provided to the programmable divider can be configured to perform one or more of the functions described in operation block 712 or operation block 718 of method 700 (FIG. 7). In an exemplary embodiment, the means 812 for adjusting the supply voltage provided to the programmable divider may comprise the processor 210 and/or the LDO voltage regulator 442. For example, the supply voltage provided by the LDO voltage regulator 442 (FIG. 4) may be decreased by decreasing the control signal, $V_{REF\_CODE}$ provided on connection 438 by 1 if the measured divide ratio, $N_{MEAS}$, is equal to the target divide ratio, $N_{DIV}$, or the supply voltage provided by the LDO voltage regulator 442 may be increased by increasing the supply voltage provided by the LDO voltage regulator 442 (FIG. 4) by increasing the control signal, $V_{REF\_CODE}$ provided on connection 438 by 1 if the measured divide ratio, $N_{MEAS}$, is unequal to the target divide ratio, $N_{DIV}$.

The apparatus 800 may also comprise means 814 for setting the supply voltage provided to the programmable divider. In certain embodiments, the means 814 for setting the supply voltage provided to the programmable divider can be configured to perform one or more of the functions described in operation block 716 or operation block 722 of method 700 (FIG. 7). In an exemplary embodiment, the means 814 for setting the supply voltage provided to the programmable divider may comprise the processor 210 and/or the LDO voltage regulator 442. For example, the processor 210 may set the minimum value for the control signal, $V_{REF\_CODE}$ that corresponds to a supply voltage, Vdd_div, that allows the programmable divider 409 (FIG. 4) to operate at its target divide ratio equal to the last code+1, and/or set the minimum value of the control signal $V_{REF\_CODE}$ that corresponds to a supply voltage, Vdd_div, that allows the programmable divider 409 (FIG. 4) to operate at its target divide ratio equal to the last code. While illustrated separately in FIG. 8, the means 812, 814 may be partially or wholly combined.

The apparatus 800 may also comprise optional means 816 for adding a code margin to the minimum value of the control signal $V_{REF\_CODE}$. In certain embodiments, the optional means 816 for adding a code margin to the minimum value of the control signal $V_{REF\_CODE}$ can be configured to perform one or more of the functions described in operation block 724 of method 700 (FIG. 7). In an exemplary embodiment, the optional means 816 for adding a code margin to the minimum value of the control signal $V_{REF\_CODE}$ may comprise the controller 436. For example, the controller 436 may be configured to add a code margin to the minimum value of the control signal $V_{REF\_CODE}$ to allow the programmable divider to operate robustly.

Implementation examples are described in the following numbered clauses:

1. A frequency divider functionality detection and adjustment circuit, comprising: an auxiliary voltage controlled oscillator (VCO) coupled to a first multiplexer (MUX); a programmable divider coupled to the first MUX; a second MUX coupled to the programmable divider; a counter coupled to the second MUX; and a controller coupled to the counter, the controller configured to adjust a supply voltage provided to the programmable divider based on a measured divide ratio, NMEAS.

2. The frequency divider functionality detection and adjustment circuit of clause 1, wherein the auxiliary VCO comprises a ring oscillator.

3. The frequency divider functionality detection and adjustment circuit of any of clauses 1 through 2, wherein the auxiliary VCO is configured to generate a signal, FVCO, at a frequency higher than a maximum expected system frequency.

4. The frequency divider functionality detection and adjustment circuit of any of clauses 1 through 3, wherein the first MUX comprises a pair of transistors.

5. The frequency divider functionality detection and adjustment circuit of any of clauses 1 through 4, wherein the first MUX is configured to select between an output of the auxiliary VCO and a system VCO signal.

6. The frequency divider functionality detection and adjustment circuit of any of clauses 1 through 5, wherein the programmable divider is configured to receive an output, FVCO, of the auxiliary VCO and a control signal and is configured to provide a divider output, FDIV.

7. The frequency divider functionality detection and adjustment circuit of any of clauses 1 through 6, wherein the counter is configured to determine a frequency of the divider output, FDIV, and a frequency of the output, FVCO.

8. The frequency divider functionality detection and adjustment circuit of any of clauses 1 through 7, wherein the controller is configured to determine from the divider output, FDIV, the measured divide ratio, NMEAS, and compare the measured divide ratio, NMEAS, with a target divide ratio, NDIV.

9. The frequency divider functionality detection and adjustment circuit of any of clauses 1 through 8, further comprising a voltage generator coupled to the programmable divider, the voltage generator configured to develop the supply voltage for the programmable divider based on a control signal, $V_{REF\_CODE}$, developed by the controller.

10. The frequency divider functionality detection and adjustment circuit of any of clauses 1 through 9, wherein the controller is configured to decrease the supply voltage provided to the programmable divider when the measured divide ratio, NMEAS equals a target divide ratio, NDIV.

11. The frequency divider functionality detection and adjustment circuit of any of clauses 1 through 10, wherein the controller is configured to increase the supply voltage provided to the programmable divider when the measured divide ratio, NMEAS is unequal to a target divide ratio, NDIV.

12. A method for adjusting a frequency divider, comprising: generating a first signal, FVCO; dividing the first signal, FVCO, to generate a second signal, FDIV; determining a frequency of the first signal, FVCO; determining a frequency of the second signal, FDIV; determining a divide ratio, NMEAS, based on the determined frequency of the first signal, FVCO, and the determined frequency of the second signal, FDIV; comparing the divide ratio, NMEAS, with a target divide ratio NDIV; and a divider control signal to obtain a minimum voltage level that causes NMEAS to equal NDIV.

13. The method of clause 12, wherein if the divide ratio, NMEAS, is equal to the target divide ratio NDIV, the method comprises adjusting a divider control signal to reduce a voltage level provided to a frequency divider.

14. The method of any of clauses 12 through 13, wherein if the divide ratio, NMEAS, is not equal to the target divide ratio NDIV, the method comprises adjusting a divider control signal to increase a voltage level provided to a frequency divider.

15. The method of any of clauses 12 through 14, further comprising setting the divider control signal to a value that includes a margin.

16. The method of any of clauses 12 through 15, further comprising generating the first signal, FVCO, at a frequency higher than a maximum expected system frequency.

17. The method of any of clauses 12 through 16, further comprising generating the first signal, FVCO, with an auxiliary voltage controlled oscillator (VCO).

18. A device, comprising: means for generating a first signal, FVCO; means for generating a second signal, FDIV, based on the first signal, FVCO; means for determining a frequency of the first signal, FVCO; means for determining a frequency of the second signal, FDIV; means for determining a divide ratio, NMEAS, based on the determined frequency of the first signal, FVCO, and the determined frequency of the second signal, FDIV; means for comparing the divide ratio, NMEAS, with a target divide ratio NDIV; and means for adjusting a divider control signal to obtain a minimum voltage level that causes NMEAS to equal NDIV.

19. The device of clause 18, wherein the means for adjusting comprise means for adjusting a divider control signal to lower a voltage level provided to the means for generating a second signal if the divide ratio, NMEAS, is equal to the target divide ratio NDIV.

20. The device of any of clauses 18 through 19, wherein the means for adjusting comprise means for adjusting a divider control signal to raise a voltage level provided to the means for generating a second signal if the divide ratio, NMEAS, is not equal to the target divide ratio NDIV.

21. The device of any of clauses 18 through 20, further comprising: means for setting the divider control signal to a value that includes a margin.

22. The device of any of clauses 18 through 21, wherein the means for generating the first signal comprise means for generating the first signal, FVCO, at a frequency higher than a maximum expected system frequency.

23. A frequency divider functionality detection and adjustment circuit, comprising: a voltage controlled oscillator (VCO) coupled configured to generate a signal, FVCO, at a frequency higher than a maximum expected system frequency; a divider configured to receive the signal, FVCO, and provide a divider signal, FDIV; a counter coupled to the VCO and the divider, the counter configured to selectively receive the signal, FVCO, and the divider signal, FDIV, and configured to determine a frequency of the divider signal, FDIV, and a frequency of the signal, FVCO; and a controller coupled to the counter, the controller configured to determine from the determined frequency of the signal, FVCO, and the determined frequency of the divider signal, FDIV, a measured divide ratio, NMEAS, and compare the measured divide ratio, NMEAS, with a target divide ratio, NDIV, the controller further configured to adjust a supply voltage provided to the divider based on the comparison of the measured divide ratio, NMEAS, and the target divide ratio, NDIV.

24. The frequency divider functionality detection and adjustment circuit of clause 23, further comprising a multiplexer (MUX), the divider configured to receive the signal, FVCO, from the VCO and to provide the divider signal, FDIV, to the MUX, the MUX configured to receive a control signal and provide the divider signal, FDIV, or the signal, FVCO, to the counter based on the control signal.

25. The frequency divider functionality detection and adjustment circuit of any of clauses 23 through 24, wherein the controller is configured to decrease the supply voltage provided to the divider when the measured divide ratio, NMEAS, equals the target divide ratio, NDIV.

26. The frequency divider functionality detection and adjustment circuit of any of clauses 23 through 25, wherein the controller is configured to increase the supply voltage provided to the divider when the measured divide ratio, NMEAS, is unequal to the target divide ratio, NDIV.

27. The frequency divider functionality detection and adjustment circuit of any of clauses 23 through 26, wherein the VCO comprises an auxiliary VCO, and wherein the frequency divider functionality detection and adjustment circuit further comprises a multiplexer (MUX) configured to select between an output of the auxiliary VCO and a system VCO signal.

28. The frequency divider functionality detection and adjustment circuit of any of clauses 23 through 27, wherein the VCO comprises an inductor portion and a switch, wherein the frequency of the signal, FVCO, varies by at least 10% based on a configuration of the switch.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A frequency divider functionality detection and adjustment circuit, comprising:
   an auxiliary voltage controlled oscillator (VCO) coupled to a first multiplexer (MUX);
   a programmable divider coupled to the first MUX;
   a second MUX coupled to the programmable divider;
   a counter coupled to the second MUX; and
   a controller coupled to the counter, the controller configured to adjust a supply voltage provided to the programmable divider based on a measured divide ratio (NMEAS).

2. The frequency divider functionality detection and adjustment circuit of claim 1, wherein the auxiliary VCO comprises a ring oscillator.

3. The frequency divider functionality detection and adjustment circuit of claim 1, wherein the auxiliary VCO is configured to generate a signal (FVCO) at a frequency higher than a maximum expected system frequency.

4. The frequency divider functionality detection and adjustment circuit of claim 1, wherein the first MUX comprises a pair of transistors.

5. The frequency divider functionality detection and adjustment circuit of claim 1, wherein the first MUX is configured to select between an output of the auxiliary VCO and a system VCO signal.

6. The frequency divider functionality detection and adjustment circuit of claim 1, wherein the programmable divider is configured to receive an output (FVCO) of the auxiliary VCO and a control signal and is configured to provide a divider output (FDIV).

7. The frequency divider functionality detection and adjustment circuit of claim 6, wherein the counter is configured to determine a frequency of the divider output (FDIV) and a frequency of the output (FVCO).

8. The frequency divider functionality detection and adjustment circuit of claim 6, wherein the controller is configured to determine from the divider output (FDIV) the measured divide ratio (NMEAS) and compare the measured divide ratio (NMEAS) with a target divide ratio (NDIV).

9. The frequency divider functionality detection and adjustment circuit of claim 1, further comprising a voltage generator coupled to the programmable divider, the voltage generator configured to develop the supply voltage for the programmable divider based on a control signal, $V_{REF\_CODE}$, developed by the controller.

10. The frequency divider functionality detection and adjustment circuit of claim 1, wherein the controller is configured to decrease the supply voltage provided to the programmable divider when the measured divide ratio (NMEAS) equals a target divide ratio (NDIV).

11. The frequency divider functionality detection and adjustment circuit of claim 1, wherein the controller is configured to increase the supply voltage provided to the programmable divider when the measured divide ratio (NMEAS) is unequal to a target divide ratio (NDIV).

12. A method for adjusting a frequency divider, comprising:
   generating a first signal (FVCO);
   dividing the first signal (FVCO) to generate a second signal (FDIV);
   determining a frequency of the first signal (FVCO);
   determining a frequency of the second signal (FDIV);
   determining a divide ratio (NMEAS) based on the determined frequency of the first signal (FVCO) and the determined frequency of the second signal (FDIV);
   comparing the divide ratio (NMEAS) with a target divide ratio (NDIV); and
   adjusting a divider control signal to obtain a minimum voltage level that causes the divide ratio (NMEAS) to equal the target divide ratio (NDIV).

13. The method of claim 12, wherein if the divide ratio (NMEAS) is equal to the target divide ratio (NDIV), the method comprises adjusting a divider control signal to reduce a voltage level provided to a frequency divider.

14. The method of claim 12, wherein if the divide ratio (NMEAS) is not equal to the target divide ratio (NDIV), the method comprises adjusting a divider control signal to increase a voltage level provided to a frequency divider.

15. The method of claim 12, further comprising setting the divider control signal to a value that includes a margin.

16. The method of claim 12, further comprising generating the first signal (FVCO) at a frequency higher than a maximum expected system frequency.

17. The method of claim 12, further comprising generating the first signal (FVCO) with an auxiliary voltage controlled oscillator (VCO).

18. A device, comprising:
   means for generating a first signal (FVCO);
   means for generating a second signal (FDIV); based on the first signal (FVCO);
   means for determining a frequency of the first signal (FVCO);
   means for determining a frequency of the second signal (FDIV);
   means for determining a divide ratio (NMEAS) based on the determined frequency of the first signal (FVCO) and the determined frequency of the second signal (FDIV);
   means for comparing the divide ratio (NMEAS) with a target divide ratio (NDIV); and
   means for adjusting a divider control signal to obtain a minimum voltage level that causes the divide ratio (NMEAS) to equal the target divide ratio (NDIV).

19. The device of claim 18, wherein the means for adjusting comprise means for adjusting a divider control signal to lower a voltage level provided to the means for generating a second signal if the divide ratio (NMEAS) is equal to the target divide ratio (NDIV).

20. The device of claim 18, wherein the means for adjusting comprise means for adjusting a divider control signal to raise a voltage level provided to the means for generating a second signal if the divide ratio (NMEAS) is not equal to the target divide ratio (NDIV).

21. The device of claim 18, further comprising:
   means for setting the divider control signal to a value that includes a margin.

22. The device of claim 18, wherein the means for generating the first signal comprise means for generating the first signal (FVCO) at a frequency higher than a maximum expected system frequency.

23. A frequency divider functionality detection and adjustment circuit, comprising:
   a voltage controlled oscillator (VCO) configured to generate a signal (FVCO) at a frequency higher than a maximum expected system frequency;
   a divider configured to receive the signal (FVCO) and provide a divider signal (FDIV);
   a counter coupled to the VCO and the divider, the counter configured to selectively receive the signal (FVCO) and the divider signal (FDIV) and configured to determine a frequency of the divider signal (FDIV) and a frequency of the signal (FVCO); and
   a controller coupled to the counter, the controller configured to determine from the determined frequency of the signal (FVCO) and the determined frequency of the divider signal (FDIV) a measured divide ratio (NMEAS) and compare the measured divide ratio (NMEAS) with a target divide ratio (NDIV) the controller further configured to adjust a supply voltage provided to the divider based on the comparison of the measured divide ratio (NMEAS) and the target divide ratio (NDIV).

24. The frequency divider functionality detection and adjustment circuit of claim 23, further comprising a multiplexer (MUX), the divider configured to receive the signal (FVCO) from the VCO and to provide the divider signal (FDIV) to the MUX, the MUX configured to receive a control signal and provide the divider signal (FDIV) or the signal (FVCO) to the counter based on the control signal.

25. The frequency divider functionality detection and adjustment circuit of claim 23, wherein the controller is configured to decrease the supply voltage provided to the divider when the measured divide ratio (NMEAS) equals the target divide ratio (NDIV).

26. The frequency divider functionality detection and adjustment circuit of claim 23, wherein the controller is configured to increase the supply voltage provided to the divider when the measured divide ratio (NMEAS) is unequal to the target divide ratio (NDIV).

27. The frequency divider functionality detection and adjustment circuit of claim 23, wherein the VCO comprises an auxiliary VCO, and wherein the frequency divider functionality detection and adjustment circuit further comprises a multiplexer (MUX) configured to select between an output of the auxiliary VCO and a system VCO signal.

28. The frequency divider functionality detection and adjustment circuit of claim 23, wherein the VCO comprises an inductor portion and a switch, wherein the frequency of the signal (FVCO) varies by at least 10% based on a configuration of the switch.

\* \* \* \* \*